United States Patent
Sicard et al.

(10) Patent No.: US 6,667,500 B2
(45) Date of Patent: Dec. 23, 2003

(54) SEMICONDUCTOR DEVICE AND METHOD FOR PROTECTING SUCH DEVICE FROM A REVERSED DRAIN VOLTAGE

(75) Inventors: Thierry Sicard, Tournefeuille (FR); Veronique C. Macary, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/126,562

(22) Filed: Apr. 19, 2002

(65) Prior Publication Data

US 2003/0008443 A1 Jan. 9, 2003

Related U.S. Application Data

(62) Division of application No. 09/510,814, filed on Feb. 23, 2000, now Pat. No. 6,413,806.

(51) Int. Cl.[7] .......................... H01L 29/76; H01L 29/94; H01L 31/062; H01L 31/113; H01L 31/119
(52) U.S. Cl. ........................................ 257/288; 257/104
(58) Field of Search ............................... 257/20, 27, 46, 257/104, 105, 106, 192, 197, 198, 288, 315, 321, 322

(56) References Cited

U.S. PATENT DOCUMENTS

| | | | | |
|---|---|---|---|---|
| 3,609,479 A | * | 9/1971 | Lin | 317/235 |
| 4,689,647 A | * | 8/1987 | Nakagawa et al. | 357/23.4 |
| 4,821,095 A | * | 4/1989 | Temple | 357/23.4 |
| 4,963,951 A | * | 10/1990 | Adler et al. | 357/23.7 |
| 5,212,396 A | | 5/1993 | Nakagawa et al. | |
| 5,504,451 A | | 4/1996 | Smayling et al. | |
| 5,721,445 A | | 2/1998 | Singh et al. | |
| 6,413,806 B1 | * | 7/2002 | Sicard et al. | 438/197 |

* cited by examiner

*Primary Examiner*—David Nhu

(57) ABSTRACT

An LDMOS field effect transistor (80) provides protection against the inadvertent reversal of polarity of voltage applied across the device. To protect an N-channel device, a floating P-type blocking region (82) is provided surrounding the drain region (32). The blocking region (82) is spaced apart from a body region (28) that forms the diffused channel (34) of the transistor (80). A first gate electrode (36) controls the conductivity of the diffused channel (34) and a second gate electrode (84) controls the conductivity of the surface (35) of the blocking region (82).

12 Claims, 2 Drawing Sheets

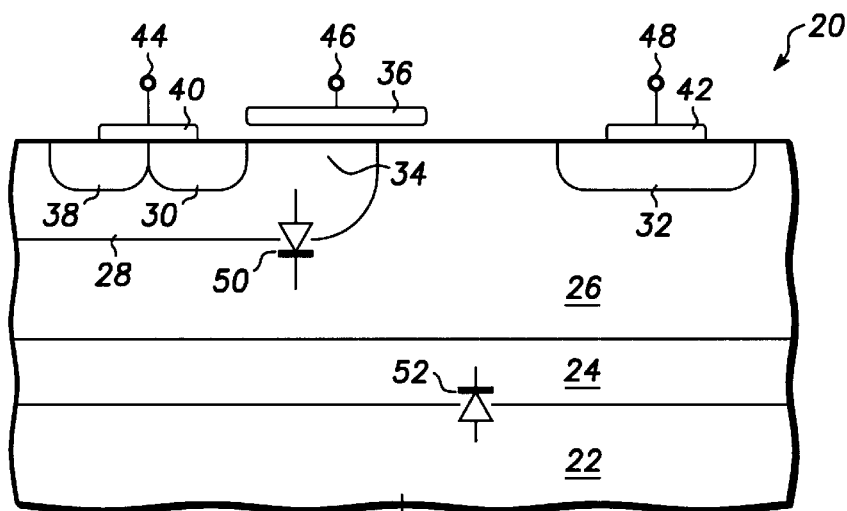
FIG. 1 — PRIOR ART —
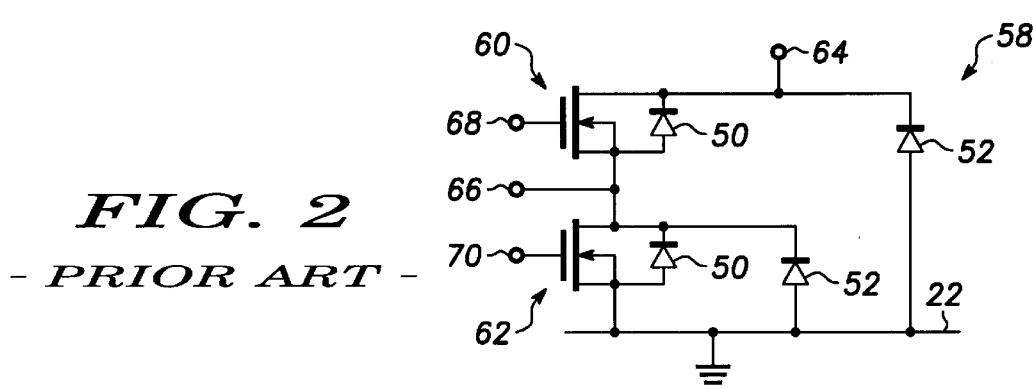
FIG. 2
— PRIOR ART —
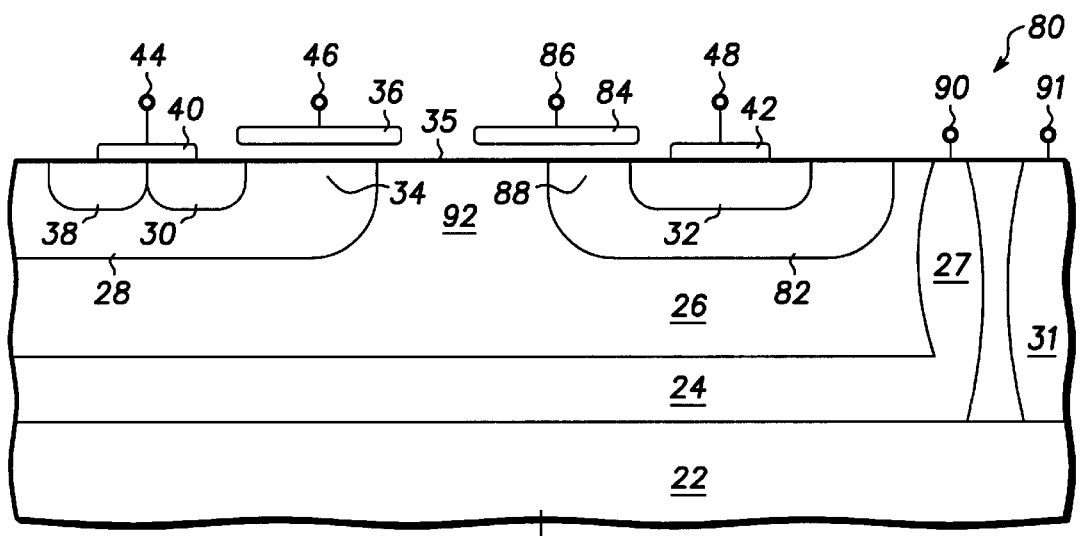
FIG. 3

US 6,667,500 B2

SEMICONDUCTOR DEVICE AND METHOD FOR PROTECTING SUCH DEVICE FROM A REVERSED DRAIN VOLTAGE

This is a division of application Ser. No. 09/510,814 filed Feb. 23, 2000 now U.S. Pat. No. 6,413,806.

BACKGROUND OF THE INVENTION

This invention relates generally to a field effect transistor and to a method for protecting such device, and more specifically to a lateral double diffused metal oxide semiconductor (LDMOS) field effect transistor and to a method for protecting that device from a reversed drain voltage.

Semiconductor devices, including discrete devices and integrated circuits, are designed to operate correctly upon the application of specified voltages to the terminals of the devices. Most semiconductor devices would not survive if the voltages applied to the devices were of the reverse polarity from the specified voltages. Some semiconductor devices are designed, for example, to operate with plus 12 volts applied to a given device terminal and most would not survive the application of minus 12 volts to that terminal. Most of such devices would be subjected to a very large and destructive current if the battery connection was accidentally reversed in this manner. Upon the application of the reversed voltage, diodes that are normally reverse biased and able to block an applied voltage of normal polarity would become forward biased and would draw a large forward bias current.

There are a number of applications, however, that require semiconductor devices to survive the accidental application of reversed polarities. For example, in some automotive circuit applications the circuit specification requires the semiconductor devices to survive a "reverse battery condition." This would be the condition that would occur if the automobile battery was accidentally connected in reverse.

Solutions that ensure reliability in the event of a reversed voltage application have relied upon adding an additional component in series with the device that is to be protected. For example, in applications requiring such reliability, the typical integrated circuit has been protected by providing an additional protective device or circuit in series with the circuit to be protected. Essentially that amounts to providing a blocking diode in series with the protected circuit. The blocking diode is forward biased during normal operation of the integrated circuit, but is blocking or reverse biased in the event the polarity of the applied voltage is reversed. Such a solution requires one or more additional devices and each of these devices adds an additional unwanted resistance or voltage offset during normal operation of the integrated circuit. For example, if the protective device is a MOSFET (metal oxide semiconductor field effect transistor) in series with the device to be protected, the intrinsic body diode of the MOSFET efficiently blocks any large current that might otherwise flow under reverse battery conditions. Under normal operation of the protected circuit, the on resistance ($R_{d\ on}$) of the protective MOSFET is in series with the resistance of the protected circuit. To make this additional resistance as small as possible (and thus insignificant to the operation of the circuit) the protective MOSFET must be made large. A large additional device is costly and is an inefficient use of available semiconductor area, especially if the protective device is to be integrated with the protected circuit.

In view of the foregoing problem and the lack of a suitable solution, a need exists for an integrated solution that provides the necessary voltage protection in the case of a reversed bias application, that does not add additional voltage offset, and that does not require the use of additional devices.

BRIEF DESCRIPTION OF THE DRAWINGS

FIG. 1 illustrates schematically, in cross-section, a portion of a prior art semiconductor device;

FIG. 2 illustrates schematically an integrated half bridge, including intrinsic diodes, utilizing the prior art structure of FIG. 1;

FIG. 3 illustrates schematically, in cross section, a field effect transistor in accordance with an embodiment of the invention;

DETAILED DESCRIPTION OF THE DRAWINGS

Figure 4:
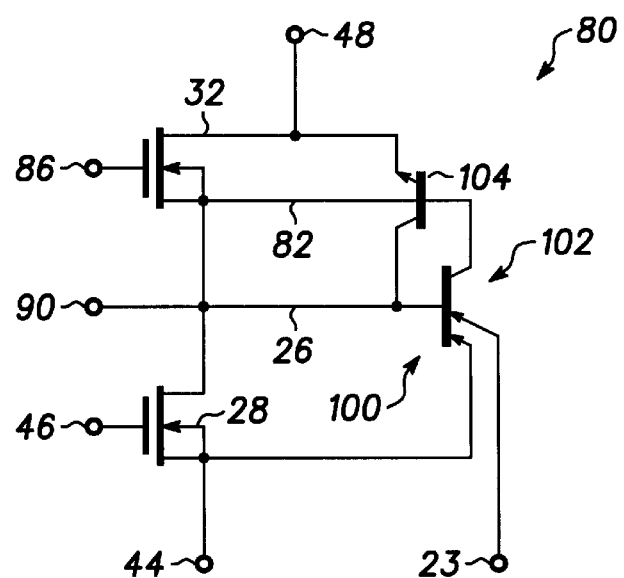
FIG. 4 illustrates schematically the device of FIG. 3 including intrinsic devices formed therewith.

FIG. 1 illustrates, in cross-section, a portion of a prior art semiconductor device 20. Device 20 is a typical lateral double diffused metal oxide-semiconductor (LDMOS) field effect transistor that might be one of many such devices constituting an integrated circuit structure. The integrated circuit might also include other MOS transistors and/or other bipolar transistors. Although the term "MOS" specifically derives from "metal-oxide-semiconductor," it will be used herein in its more generic sense to refer to any insulated gate field effect transistor regardless of the material used for either the gate electrode or the gate insulator. The remainder of the term derives from the fact that the current through the device flows laterally, i.e., along the surface of the device, through a channel region that (in addition to the source and drain regions) is formed by impurity diffusion. For purposes of illustration only, all devices to be described herein will be N-channel silicon gate devices. Those of skill in the art will understand that such descriptions are equally applicable to P-channel devices. For such P-channel devices the conductivity of all regions would be reversed from the illustrated description and all voltage polarities would be reversed. That is, N-regions would be substituted for P-regions, and vice versa. Additionally, all devices described herein will be illustrated as silicon devices, but the description is equally applicable to devices fabricated in other semiconductor materials such as gallium arsenide or other III–V materials, II–VI materials, mixtures of silicon and germanium, and the like.

Device 20 includes a P-type silicon substrate 22 on which a high conductivity N-type buried layer 24 is formed. An N-type epitaxial layer 26 is grown overlying buried layer 24. A P-type body region 28 is formed in epitaxial layer 26. High conductivity N-type source region 30 and drain region 32 are formed in the body region and epitaxial layer, respectively. The portion of body region 28 that lies between source region 30 and the epitaxial layer 26 forms a diffused channel 34 of the MOS transistor. A gate electrode 36 overlies channel 34 and is insulated from the channel by a gate dielectric (not shown). A heavily doped P-type region 38 is also formed in body region 28. A conductive electrode 40 makes electrical contact to source region 30 and to P-type region 38 and electrically shorts the two regions together. The short between source region 30 and P-type region 38 effectively shorts the source region to body region 28. A conductive electrode 42 makes electrical contact to drain region 32. Terminals 44, 46, and 48 make electrical contact to the source, gate, and drain, respectively, of the LDMOS transistor.

In its intended operation, drain region 32 is biased positively with respect to source region 30. A bias applied to gate electrode 36 modulates the conductivity of channel 34 and causes the controlled flow of current between source and drain. During such operation, substrate 22 is normally maintained at the lowest potential available for operation of the circuit, often at the same potential as the source region.

As is illustrated, two PN junction diodes are intrinsically formed as part of device structure 20. Diode 50 is a pn junction diode formed by body region 28 and epitaxial layer 26. A second diode, pn junction diode 52, is formed by substrate 22 and buried layer 24. During the normal operation of device 20, in which drain region 32 is more positive than either source region 30 or substrate 22, both diodes are reversed biased, and the only current that flows through these diodes is the very low current associated with a reverse biased diode. This is in addition, of course, to the normal current that flows from source to drain through channel 34 if a voltage in excess of the threshold voltage is applied to gate 36. If, however, the polarity applied to device 20 is inadvertently reversed so that drain region 32 is biased more negatively than source region 30 and substrate 22, as would be the case if battery connections attached to the device were reversed, both diodes would be forward biased and a large forward bias diode current would flow through the device. Unless somehow limited, for example, by an additional blocking diode or a current limiting resistor, the forward bias diode current flowing through device 20 might have serious consequences, even to the extent of resulting in the destruction of device 20.

FIG. 2 illustrates schematically one application in which two devices 60 and 62, each similar to device 20, might be serially connected to form an integrated half bridge 58. Such an integrated device finds application, for example, in the automotive industry. An automotive battery or other power supply (not illustrated) is coupled between a terminal 64 at the drain of device 60 and ground. The substrate of the integrated device is coupled to ground. LDMOS transistor 60 forms a high side switch controlled by a gate terminal 68 and LDMOS transistor 62 forms a low side switch controlled by a gate terminal 70. The output of the integrated half bridge is taken at output terminal 66. Four intrinsic diodes are formed as part of the integrated half bridge in a similar manner to the formation of diodes 50 and 52 illustrated in FIG. 1. The corresponding diodes have been labeled by these same numerals in FIG. 2.

Integrated half bridge 58 functions normally if terminal 64 is coupled to the positive terminal of the applied power supply. If, however, the applied power supply terminals are reversed and terminal 64 is coupled to the negative terminal of the applied power supply, diodes 50 and 52 are forward biased and bridge 58 malfunctions or, in a worst case, is destroyed.

One solution (not illustrated) has been to connect an additional MOS transistor in series with the half bridge. The additional MOS transistor is coupled between substrate 22 and ground in a polarity reversed from that of device 62. That is, the substrate and source of the additional transistor are coupled to the substrate and source of device 62 so that substrate 22 is raised above ground and the intrinsic diodes in the additional transistor are reversed with respect to diodes 50 and 52. Thus if diodes 50 and 52 are inadvertently biased in the forward direction, the intrinsic diodes in the additional transistor are reverse biased. The reverse biased diodes prevent the unwanted flow of a large current during the reversed battery condition. When the battery is connected to the half bridge in the normal manner, the intrinsic diodes in the additional transistor are forward biased and are shunted by the channel of the additional MOS transistor. The on resistance of the additional transistor is in series with the half bridge. Because any additional resistance is undesirable, the additional transistor must be made large to reduce its on resistance. The solution, though effective, is undesirable.

FIG. 3 illustrates schematically, in cross-section, a dual gate LDMOS transistor 80 in accordance with one embodiment of the invention that overcomes the aforementioned problems and provides protection against the inadvertent reversal of applied potential to the device. Like regions have been identified by like numerals. Dual gate LDMOS transistor 80 includes a semiconductor substrate 22 formed of P-type silicon. Overlying at least a portion of the semiconductor substrate 22 is a heavily doped, high conductivity N-type buried layer 24. Those of skill in the art will recognize that buried layer 24 will be patterned so as to be present in those portions of the integrated circuit that require such a low conductivity region. Overlying buried layer 24 is an epitaxial layer 26 of N-type silicon. A low resistivity connection to buried layer 24 can be made, if necessary, through a deep, heavily doped N-type diffused region 27. Additionally, a deep, P-type doped region 31 extending from the surface of epitaxial layer 26 to the underlying P-type substrate 24 can be formed to effectively isolate transistor 80 from other components of the integrated circuit.

A P-type body region 28 formed in epitaxial layer 26 provides a channel 34 at a surface 35 of epitaxial layer 26. A source region 30 of N-type conductivity is formed at surface 35 within body region 28. A high conductivity P-type region 38 is also formed at the surface in body region 28. A source electrode 40 forms an electrical short between source region 30 and high conductivity P-type region 38. This short serves to electrically short the source to the body region.

In accordance with this embodiment of the invention, an additional, electrically floating, P-type blocking region 82 is formed at the surface of epitaxial layer 26 at a location spaced apart from body region 28. The portion of epitaxial region 26 located between body region 28 and floating P-type blocking region 82 forms a drift region 92. A pn junction is formed between the P-type blocking region and the N-type drift region. Drain region 32 is formed in P-type blocking region 82 at surface 35 of the epitaxial layer so that P-type blocking region 82 surrounds the drain region at surface 35. A gate electrode 36 controls the conductivity of channel 34 formed at the surface of body region 28. A gate electrode 84 (and hence the name "dual gate" LDMOS) controls the conductivity of a second channel 88 formed at surface 35 of P-type blocking region 82. An electrode 42 makes contact to drain region 32.

Terminals 44, 46, and 48 provide electrical contact to the source, gate electrode 36, and drain, respectively. An additional terminal 86 provides electrical contact to gate electrode 84. Gate electrode 36 overlies channel 34 and gate electrode 84 overlies channel 88 of P-type blocking region 82. Although not illustrated in the figure, each of the gate electrodes is spaced apart from the surface of the semiconductor material by a gate insulator such as silicon dioxide or the like. Terminal 90 is coupled to heavily doped N-type region 27 and terminal 23 is coupled to substrate 22. Alternatively, contact to substrate 22 can be made through a terminal 91 coupled to P-type region 31.

In the normal operation of device 80, drain terminal 48 is biased positively with respect to source terminal 44. Substrate terminal 23 is held at the lowest potential available for the circuit. Terminal 46, coupled to gate electrode 36, receives a control signal. When the control signal exceeds the threshold voltage of the device, current is conducted from source 30 through channel 34 to a drift region 92 at surface 35 of epitaxial layer 26. The signal applied to gate electrode 36 thus controls the flow of current through channel 34. Gate terminal 86, coupled to gate electrode 84, is maintained at a sufficiently positive bias to invert the surface of electrically floating P-type blocking region 82 and to thereby form channel 88. The voltage applied to gate electrode 84 thus modulates the conductivity of channel 88 and controls the flow of current through channel 88. A current carrying path thus exists from source region 30, through channel 34 and drift region 92, to drain region 32 through the inverted surface of P-type region 82.

Because of the presence of the additional P-type blocking region, device 80 is protected from the inadvertent application to terminal 48 of a bias that is more negative than the bias applied to terminal 44 or to terminal 23. The intrinsic diodes illustrated in FIG. 1, that is, diodes 50 and 52, are no longer connected directly to drain region 32. Instead, there is now a floating P-type blocking region 82 interposed between the diode and the drain region. In accordance with one embodiment, terminal 86 is coupled to terminal 48 so that both are coupled to receive the battery voltage. If the battery is properly connected so that terminal 48 is positive, gate electrode 84 is also positive and channel 88 is conducting. If the battery connection is reversed, terminal 48 is negative as is gate electrode 84. With negative bias on gate electrode 84, channel 88 is non conductive. Preferably terminal 90 is grounded.

In accordance with a further embodiment of the invention, terminal 86 is coupled to a logic circuit (not illustrated) that controls the bias on gate electrode 84. The logic circuit can apply any appropriate bias to the gate electrode. For example, the logic circuit can apply the same bias as is applied to the drain or, in some applications can apply a bias such as the drain voltage plus an additional positive voltage. The additional voltage may be necessary when, for example, device 80 is used in an application for which the source of the device can swing to positive voltages. Further, the logic circuit can control the bias applied to terminal 90 and hence to contact region 27 and buried layer 24. By controlling the bias on buried layer 24, the potential of epitaxial layer 26 and drift region 92 can be controlled.

With additional P-type region 82, device 80 illustrated in FIG. 3 can be viewed as including three intrinsic bipolar transistors: a lateral pnp transistor, a vertical pnp transistor, and an npn transistor. FIG. 4 schematically illustrates the connection of the three intrinsic bipolar transistors as part of the dual gated LDMOS transistor. Lateral pnp transistor 100 includes a P-type emitter region formed by body 28, an N-type base region formed by epitaxial layer 26, and a P-type collector region formed by P-type blocking region 82. Vertical pnp transistor 102 includes a P-type emitter formed by P-type substrate 22, an N-type base formed by epitaxial layer 26, and a P-type collector formed by P-type blocking region 82. An npn transistor 104 includes an N-type emitter formed by drain region 32, a P-type base region formed by P-type blocking region 82, and an N-type collector formed by epitaxial layer 26.

The three transistors form two thyristors. A lateral thyristor is formed by lateral pnp transistor 100 in combination with npn transistor 104. A vertical thyristor is formed by vertical pnp transistor 102 in combination with npn transistor 104. For optimum performance of device 80, the intrinsic transistors and hence the intrinsic thyristors are preferably designed and implemented to avoid latching of either of the thyristors. A thyristor will not latch if the product of the current gains of the two respective transistors ($\beta_n$ for the npn transistor and $\beta_p$ for the pnp transistor) is less than one. For the vertical thyristor, $\beta_n$ will in most cases be less than about 100 if the same dopant distribution is used for P-type blocking region 82 as is used for body region 28. The current gain for the vertical pnp transistor, $\beta_p$, is very low, usually less than about 0.005, because of the presence of the heavily doped buried layer 24. This follows from the fact that the current gain of a transistor is inversely proportional to the integrated base doping under the emitter, and in the case of pnp transistor 102, the base doping includes the doping in buried layer 24. The product $\beta_n \beta_p$ for the two transistors that form the vertical thyristor therefore is less than one. If a reverse battery voltage is applied to device 80 so that terminal 48 is attached to the negative battery terminal, the vertical thyristor would be biased to turn on. The low value of the product $\beta_n \beta_p$, however, prevents the vertical thyristor from latching.

Figure 5:
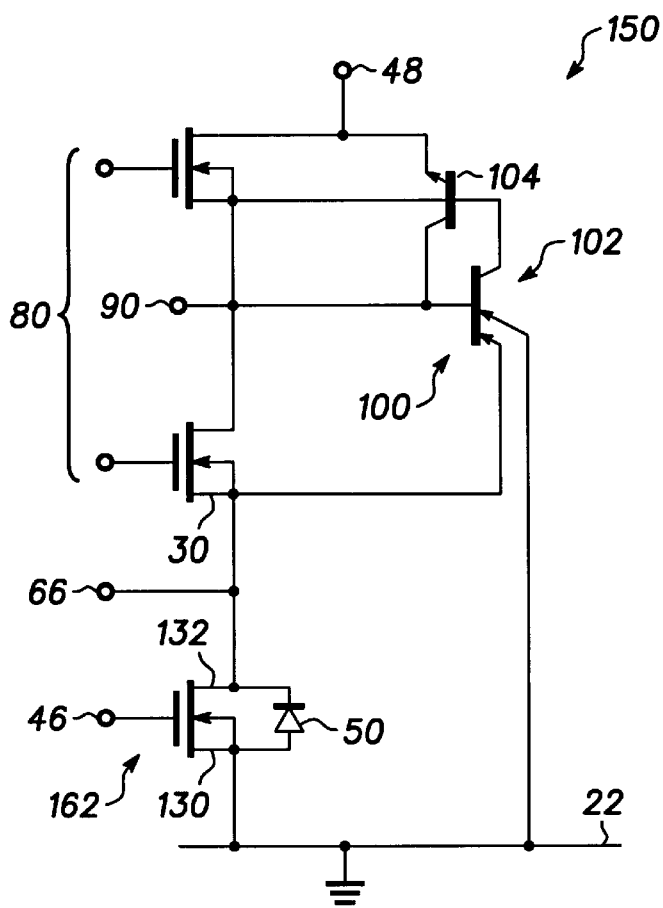
FIG. 5 illustrates schematically an application of an embodiment of the invention in an integrated application including intrinsic devices formed therewith.

Because of the processing used to fabricate device 80, it is likely that the product of the current gains of lateral pnp transistor 100 and npn transistor 104 will exceed one, the condition necessary for the lateral thyristor to latch. The lateral thyristor cannot latch, however, when used in a half bridge configuration, for reasons illustrated in FIG. 5. FIG. 5 illustrates schematically an integrated half bridge 150, in which a device 80, in accordance with the invention, is used as a high side switch. Source region 30 of LDMQS transistor 80 is coupled to drain 132 of MOS transistor 162. Source 130 of transistor 162 is coupled to ground. The output of the half bridge is taken at terminal 66 coupled to source 30 of transistor 80 and to drain 132 of transistor 162. The intrinsic transistors 100, 102, and 104 as well as intrinsic diode 50 associated wit transistor 162 are also illustrated. Consider the situation in which terminal 48 is inadvertently coupled to a negative voltage. The lateral thyristor that includes npn transistor 104 and lateral pnp transistor 100 can turn on only if lateral pnp transistor 100 itself turns on. In order for the lateral pnp transistor to turn on, however, the emitter-base junction of the pnp transistor must be forward biased. That is, a voltage of $V_{be}$ (the voltage drop across a forward biased pn junction diode) must be applied across the emitter-base junction. Such a voltage drop cannot occur across the emitter-base junction of lateral pnp transistor 100 because the emitter of transistor 100 is at one $V_{be}$ above ground because of the forward bias across body diode 50. At the same time, the base of pnp transistor 100 is also one $V_{be}$ above ground because the emitter of lateral pnp transistor 102 is coupled to ground. The base of transistor 102 (which is also the base of transistor 100) cannot be more tan one $V_{be}$ more positive than its emitter. Therefore, when transistor structure 80 is used as the high side switch in an integrated half bridge, the lateral thyristor cannot turn on. is used as the high side switch in an integrated half bridge, the lateral thyristor cannot turn on.

If device 80, in accordance with an embodiment of the invention, is used in a stand-alone application and not in, for example, a half bridge application, the lateral thyristor can be controlled and kept from latching by grounding terminal 90. Grounding terminal 90 grounds the base of lateral pnp transistor 100 and prevents the base-emitter junction of that device from being forward biased.

Again, referring to FIG. 3, the amount of reversed voltage that can be successfully sustained by device structure 80 is determined, at least in part, by the spacing between body region 28 and blocking region 82. If a negative voltage is applied to terminal 48, the pn junction formed between blocking region 82 and epitaxial layer 26 (or drift region 92) is reversed biased. As the depletion spread from the reverse biased junction spreads across the drift region at the surface of epitaxial layer 26, the spread eventually, upon the application of sufficient reverse bias voltage, reaches body region 28 and punch through breakdown occurs. The spacing between regions 28 and 82 must, therefore, be adjusted to accommodate the maximum expected reversed voltage that may be applied across the pn junction formed by P-type blocking region 82 and epitaxial layer 26.

A semiconductor device, in accordance with an embodiment of the invention, such as device 80 illustrated in FIG. 3 can be fabricated using conventional integrated circuit fabrication techniques. Device 80 can be fabricated, for example, as part of an integrated circuit structure on a P-type semiconductor substrate having a resistivity of about 6 Ohm centimeter. A buried layer can be formed by selectively diffusing arsenic into portions of the upper surface of the silicon substrate. In addition to being used to controllably lower the current gain of the intrinsic vertical pnp transistor, the buried layer may be used in other portions of the circuit, for example, to reduce the collector resistance of an npn transistor if the integrated circuit being fabricated utilizes both bipolar and field effect transistors. The buried layer can have, for example, a sheet resistivity of about 18 Ohms per square. Following the formation of the buried layer, an N-type epitaxial layer having a resistivity of about 1 Ohm centimeter can be deposited to a thickness of about 10 micrometers. Insulating layers for device isolation and for gate electrodes can be formed on the surface of the epitaxial layer. The gate insulator can be formed, for example, by thermal oxidation to form a silicon dioxide layer having a thickness of 35 nanometers. Gate electrodes can be formed overlying the gate insulator by the deposition and patterning of a layer of polycrystalline silicon. The polycrystalline silicon can be deposited to a thickness of about 400 nanometers. The patterned polycrystalline silicon is then preferably used as an ion implantation mask for the P-type ion implantion doping of the body region and the floating blocking region. The body region and blocking region are preferable doped with boron to a dose that yields, after a subsequent thermal redistribution step, regions having a junction depth of about 2 micrometers and a sheet resistivity of about 600 Ohms per square. By providing a spacing between the two P-type regions of about 1.8 micrometers, a punch through voltage of about 13.5 volts can be assured. This is sufficient to provide protection against the application of a reversed voltage of about 12 volts. The patterned polycrystalline silicon is then used as an ion implantation mask for the N-type ion implantion doping of the source and drain regions. The source and drain regions are preferably doped with arsenic and have a depth of about 0.4 micrometers and a sheet resistivity of about 50 Ohms per square. Using the same patterned polycrystalline silicon to mask both ion implantations provides self alignment between the source and body and between the drain and floating blocking region. Using the polycrystalline gate regions as an ion implantation mask also provides self alignment between the gate electrode and the underlying channel. Contact to and interconnection of the various device regions can then be accomplished in conventional manner.

Thus it is apparent that there has been provided, in accordance with the invention, a semiconductor device and method for protecting such device from a reversed drain voltage. Although the invention has been described and illustrated with reference to preferred embodiments, it is not intended that the invention be limited to these illustrative embodiments. For example, the invention can be applied to other integrated circuit applications. Likewise, other processing techniques, device sizes, doping types, junction depths and resistivities, dielectric types and isolation techniques can be used to fabricate the inventive devices. Accordingly, it is intended to include within the invention all such modifications and variations as fall within the scope of the appended claims.

What is claimed is:

1. A semiconductor device comprising:
   a semiconductor substrate of a first conductivity type;
   an epitaxial layer of a second conductivity type overlying the semiconductor substrate and having a surface;
   a body region of first conductivity type formed in the epitaxial layer and intersecting the surface thereof;
   a source region of second conductivity type formed in the body region;
   an electrically floating region of the first conductivity type formed in the epitaxial layer, intersecting the surface thereof, and spaced apart from the body region;
   a drain region of the second conductivity type formed in and surrounded at the surface by a portion of the electrically floating region;
   a first gate electrode overlying a portion of the body region; and
   a second gate electrode overlying the portion of the electrically floating region.

2. The semiconductor device of claim 1 further comprising a high conductivity buried layer of second conductivity type underlying and vertically spaced apart from the body region and the electrically floating region.

3. The semiconductor device of claim 2 further comprising:
   a doped region of second conductivity type extending from the surface to the buried layer; and
   a terminal coupled to the doped region at the surface.

4. The semiconductor device of claim 1 further comprising a source electrode coupled to the source region and to the body region and forming an electrical short between the source region and the body region.

5. The semiconductor device of claim 1 further comprising a second transistor having a second source region and a second drain region, the second drain region coupled to the source region.

6. The semiconductor device of claim 5 wherein the source region is coupled to an output terminal.

7. The semiconductor device of claim 1 further comprising:
   an isolation region of first conductivity type extending from the surface to the semiconductor substrate; and
   a substrate contact electrode coupled to the isolation region.

8. A semiconductor device for controlling the flow of current from a source region to a drain region, the device comprising:
   a source region of a first conductivity type;
   a drift region of the first conductivity type spaced apart from the source region by a first channel of a second conductivity type;
   a drain region of the first conductivity type spaced apart from the drift region by a second channel of the second conductivity type;

a first gate electrode overlying the first channel; and a second gate electrode overlying the second channel.

9. An improved field effect transistor having a source region, a drift region, and a drain region, each of a first conductivity type, and a channel of a second conductivity type wherein the improvement comprises:

an electrically floating region spaced apart from the channel, the electrically floating region having a surface of the second conductivity type, forming a pn junction with the drift region, and surrounding the drain region; and a gate electrode overlying the electrically floating region.

10. The improved field effect transistor of claim 9 wherein the gate electrode is configured to control a current flow at the surface of the electrically floating region upon the application to the gate electrode of a predetermined voltage.

11. The improved field effect transistor of claim 9 further comprising:

a buried layer of first conductivity type positioned underlying the drift region; and a contact electrode coupled to the buried layer.

12. The improved field effect transistor of claim 11 wherein the buried layer is configured to control the potential applied to the drift region upon the application to the contact electrode of a predetermined voltage.

* * * * *